United States Patent [19]

Heppinstall et al.

[11] Patent Number: 4,733,192

[45] Date of Patent: Mar. 22, 1988

[54] AMPLIFYING ARRANGEMENTS INCLUDING A KLYSTRON HAVING A POWER TRANSFER CHARACTERISTIC WHICH IS SUBSTANTIALLY THE SAME OVER ITS ENTIRE PASSBAND

[75] Inventors: Roy Heppinstall, Witham; George I. F. Tupper, High Wycombe; Paul Eaton, Crawley; Edmund K. Tunstall, Carlton on Otmoor, all of United Kingdom

[73] Assignees: British Broadcasting Corporation, London; English Electric Valve Company Limited, Chelmsford, both of England

[21] Appl. No.: 879,607

[22] Filed: Jun. 27, 1986

[30] Foreign Application Priority Data

Jul. 2, 1985 [GB] United Kingdom ................ 8516731

[51] Int. Cl.$^4$ .............................................. H03F 3/56
[52] U.S. Cl. ..................................................... 330/45
[58] Field of Search ....................... 330/43, 44, 45, 46, 330/136, 149; 331/83; 358/186

[56] References Cited

U.S. PATENT DOCUMENTS 4,591,799  5/1986  Faillon et al. ......................... 330/45
4,670,789  6/1987  Plume ................................... 358/186

OTHER PUBLICATIONS

Tupper, G. I. F., "Klystron Efficiency Improvements in UHF Vision Transmitters", Digest No. 1984/22, IEEE.

Primary Examiner—Eugene R. Laroche
Assistant Examiner—Steven J. Mottola
Attorney, Agent, or Firm—Spencer & Frank

[57] ABSTRACT

Klystrons are inherently non-linear and have an amplification characteristic which is frequency dependent on both signal amplitude and beam current. This may be compensated for by applying suitable correcting signals to a beam controlling electrode of the klystron thereby changing its electron beam current over the whole excursion of a modulating signal. A klystron arrangement in accordance with the invention is particularly suitable for use in a television transmitter, enabling full time modulation to be carried out with a significant improvement in the operating efficiency of the klystron.

10 Claims, 9 Drawing Figures

AMPLIFYING ARRANGEMENTS INCLUDING A KLYSTRON HAVING A POWER TRANSFER CHARACTERISTIC WHICH IS SUBSTANTIALLY THE SAME OVER ITS ENTIRE PASSBAND

BACKGROUND OF THE INVENTION

This invention relates to amplifying arrangements employing klystrons or like devices and more particularly, but not exclusively, to such arrangements comprising television transmitters.

In a television transmitter typically a klystron amplifies a radio frequency carrier, which has been modulated with either a video signal, or with video and sound signals simultaneously, the latter mode of operation being known as a "multiplexed" mode.

A "klystron" is a device for amplifying high frequency signals. A typical klystron comprises an electron gun section and an interaction region. The electron gun section includes a cathode at which electrons are emitted in a beam and a beam controlling electrode which controls the magnitude of the electron beam current. The interaction region comprises a cavity at which the high frequency signal to be amplified velocity modulates the electrons of the beam, and typically comprises several cavities, the amplified signal being taken from the final one.

In a previous high frequency amplifying arrangement comprising a television transmitter, the modulated radio frequency carrier is applied to an input cavity of the klystron. Since a klystron is not a linear amplifying device, the signal modulating the radio frequency carrier must be distorted before the modulated carrier is coupled into the klystron to correct for the non-linearity and obtain satisfactory transmitter performance. However in such an arrangement the klystron electron beam current is at a constant high level throughout operation since it must be sufficient to enable the required output power for transmission of the synchronising pulses to be obtained. This results in low operating efficiencies during the picture period of the television signal, the picture period being approximately 93 percent of the total operating period. The klystron radio frequency output power required during the picture period is much lower than that required during the synchronising pulse period. Thus the operating efficiency of the klystron may be improved by pulsing the beam current so that it is high during the synchronising pulse period and lower during the picture period, giving a reduction in the average klystron beam power.

SUMMARY OF THE INVENTION

The present invention seeks to provide a further improved klystron arrangement.

According to this invention there is provided an amplifying arrangement including a klystron; means for applying a high frequency carrier modulated with a modulating signal to an interaction cavity of the klystron; and means for controlling the potential of a beam controlling electrode of the klystron in dependence on the modulating signal, whereby the power transfer characteristic is made substantially the same at substantially all frequencies over a desired passband of the klystron. By "desired passband" it is meant that part of the klystron passband at which it is wished to operate. The power transfer characteristic is the relationship between the power of the modulated signal applied to the klystron and that of the amplified signal at an output cavity of the klystron i.e, the amplitude of the modulation envelope before and after amplification. Controlling the potential of the beam controlling electrode in dependence on the modulating signal may be termed "full time modulation" and results in high operating efficiencies being obtainable.

The inventors have recognised that the power transfer characteristic across the passband of the klystron follows substantially the same law, i.e, has the same form, at all frequencies in the klystron passband, although the gain of the klystron varies with frequency. By employing the invention it is possible to apply a correcting signal to the beam controlling electrode so as to change the power transfer characteristic, for example so that it is linearised at all frequencies. It is preferred that the means for controlling the potential of the beam controlling electrode includes means for determining the frequency of the modulating signal, and means for changing the amplitude of a signal applied to the electrode by an amount depending on the frequency.

In one embodiment of the invention the potential of the beam controlling electrode is controlled whereby the klystron power transfer characteristic is made substantially linear. A consequence of the linearisation of the klystron power transfer characteristic to the modulation envelope is a reduction in the re-inserted lower sideband components of a klystron operated in a vision socket, i.e, a "vision only" klystron. In another embodiment of the invention the potential of the electrode is controlled so that the operating efficiency of the klystron is at a maximum, i.e, so that the average klystron beam power during operation is minimised. The operating frequency may be improved over that of previously known klystrons by an amount which depends on the degree of correction given by the signal applied to the beam controlling electrode.

The operation of these two embodiments is illustrated by FIG. 1, where the substantially linearised power transfer characteristic is shown by line 'a' and the power transfer characteristic at which optimum operating efficiency obtains is shown by curve 'b'. Of course some other degree of correction could be applied to achieve other resultant power characteristics 'c' or 'd'.

Preferably there are included means for determining the amplitude of the modulating signal and means for controlling the potential of the electrode according to the amplitude determined. Thus in a television broadcasting arrangement, the electron beam current of the klystron may be varied in accordance with the amplitude level of the modulating waveform during the picture period and increased to the required value during the synchronising pulse period.

Preferably the beam controlling electrode is a grid for controlling the magnitude of the electron beam current, thus enabling the magnitude of the beam current to be altered without substantially changing the beam shape. However klystrons other than gridded klystrons may be employed, for example a klystron having its beam current controlled by an annular electrode may be used, or alternatively a klystron in which a modulating anode is used. In these two types of klystron the beam controlling electrode which has its potential controlled is either the annular electrode or the modulating electrode as appropriate.

According to a feature of this invention, a transmitter arrangement, and in particular a television transmitter arrangement, includes a high frequency amplifying arrangement in accordance with the invention. The invention may be particularly advantageously employed where a transmitter is operated in a multiplexed mode, since linearisation of the power transfer characteristic to the modulated envelope also results in reduction in the absolute levels of generated inter-modulation products including lower sideband re-insertion. This enables the klystron to be operated at higher output power levels than possible with previous arrangements whilst still meeting transmitter inter-modulation product specifications.

BRIEF DESCRIPTION OF THE DRAWINGS

The invention is now further described by way of example with reference to the accompanying drawings in which:

FIGS. 2 and 3 schematically illustrate an arrangement in accordance with the invention;

DESCRIPTION OF PREFERRED EMBODIMENT

Figure 1:
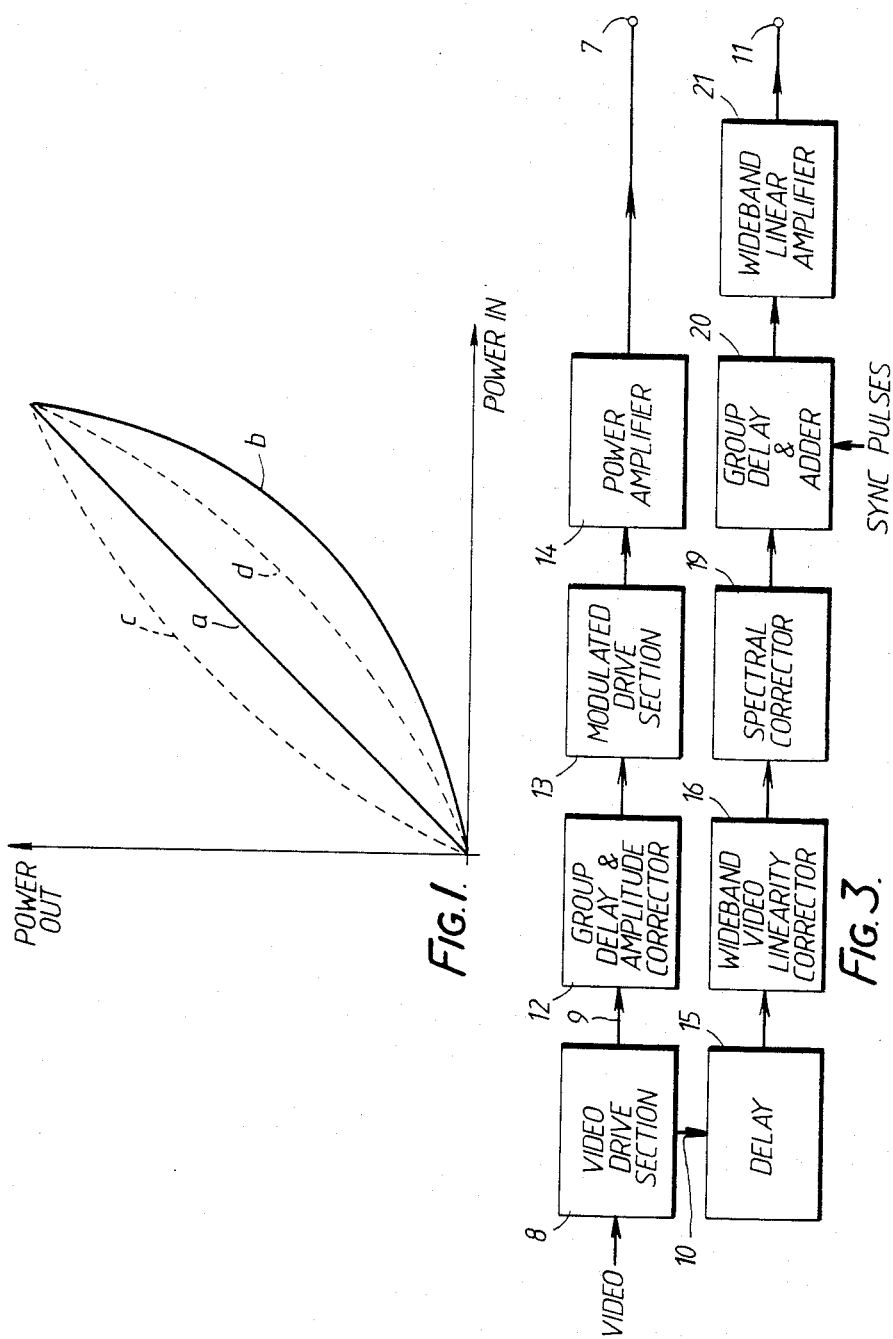
FIG. 1 shows power transfer characteristics for this invention.
Figure 2:
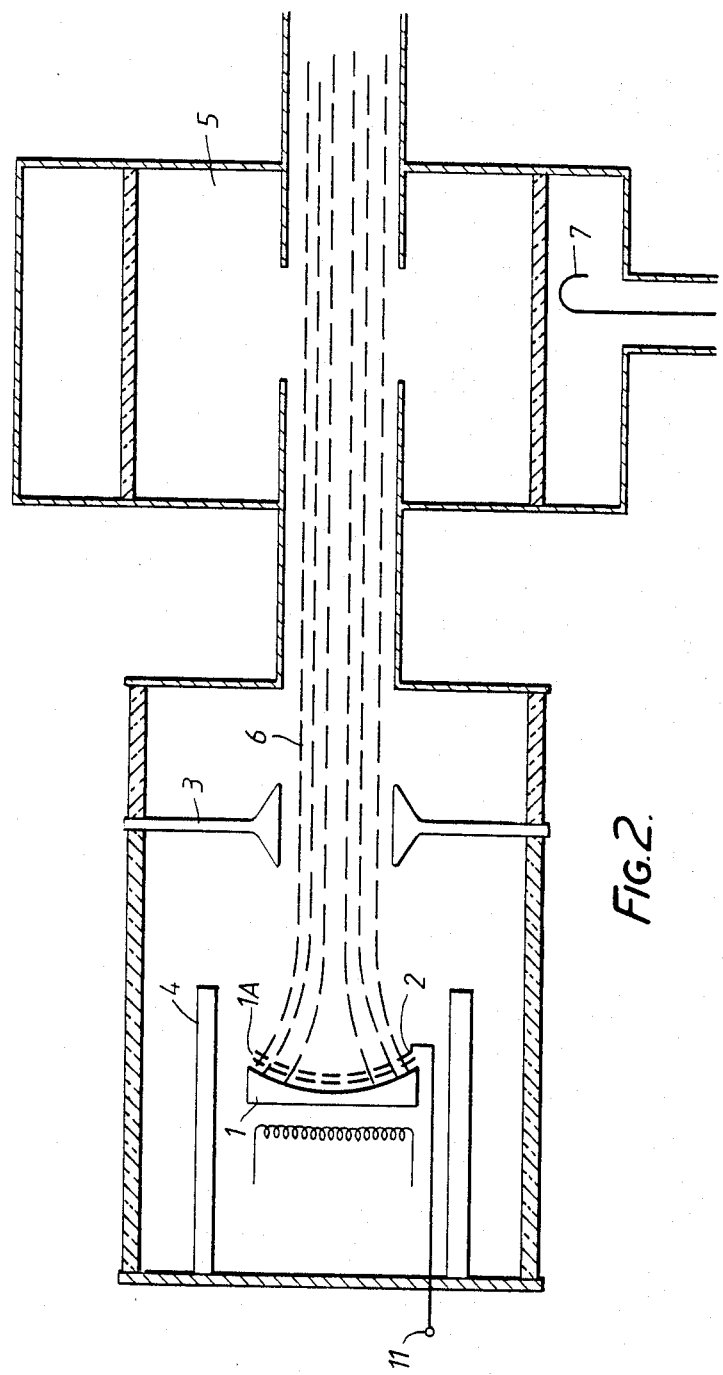

With reference to FIG. 2, a television broadcasting arrangement includes a klystron for amplifying a radio frequency signal prior to its transmission, the radio frequency signal comprising a radio frequency carrier modulated by a video signal. The klystron has an electron gun section comprising a cathode 1, grid 2, modulating anode 3 and an annular focusing electrode 4 and a radio frequency section comprising several cavities, only the first cavity 5 of which is shown. The annular focusing electrode 4 is at cathode potential, as is another grid 1A which is in register with the grid 2 and is located between it and the cathode 1 to prevent emitted electrons impinging on the grid 2. During operation of the klystron, electrons are emitted from the cathode 1 in a beam 6 directed along the longitudinal axis of the klystron. The radio frequency signal is coupled into the first cavity 5 at 7 and velocity modulates the electrons of the beam 6. The radio frequency signal is amplified at subsequent cavities, being coupled from the final cavity and applied to an antenna for radiation. The electrons of the beam 6 are collected beyond the final cavity at a collector (not shown).

The grid 2 is a beam controlling electrode, having a potential applied to it at 11 which controls the electron beam current. The applied potential is varied to alter the magnitude of the beam current in accordance with the amplitude of the video frequencies of the modulating signal to modify the non-linear power transfer characteristics of the klystron so that it becomes essentially linear as regards the modulated envelope. Thus the input radio frequency signal applied to the first cavity 5 is substantially the same in form as the amplified RF signal which is to be transmitted.

The manner in which the potential of the grid 2 is controlled is now described with reference to FIG. 3. A video signal containing picture information which it is desired to transmit is applied to a video drive section 8, from which two output signals are derived. One output signal on line 9 is the modulating signal which is imposed on the radio frequency carrier, and then coupled at 7 to the first cavity 5 of the klystron. The other output signal on line 10 is processed and then applied to the grid 2 of the klystron at 11 to control its potential.

The output signal of the video drive section 8 on line 9 is applied to a group delay and amplitude corrector 12. This corrects group delay. It also compensates for the variations in gain of the frequency response which arise because of the amplitude modulation effects on the klystron electron beam resulting from the changing video signal applied to the grid 2. The output signal of the corrector 12 is then applied to a modulated radio frequency drive section 13, where it modulates the radio frequency carrier. The radio frequency signal output of the drive section 13 is amplified by a linear power amplifier 14 and then coupled into the first cavity 5 of the klystron at 7.

The video signal on line 10 obtained from the video drive section 8 is applied via a delay 15 to a wideband video linearity frequency corrector 16. The delay 15 is adjusted to compensate for the differences in time taken for processing the signal applied to the grid 2 and that applied to the first cavity 5, to ensure that there is synchronisation between the modulating signal and the magnitude modulation of the klystron electron beam.

Figure 4C:
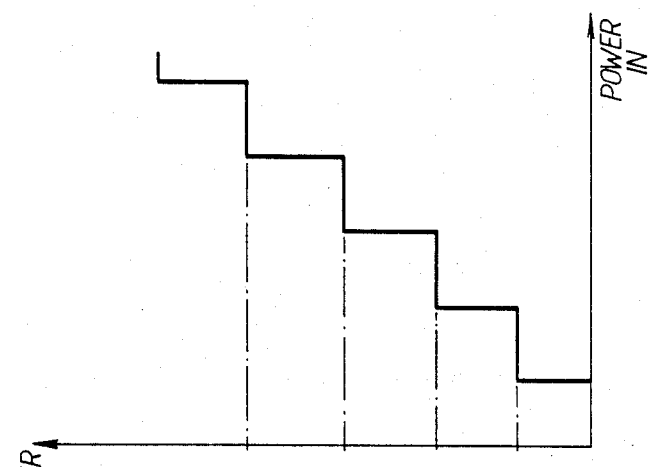
FIGS. 4a, 4b, 4c and 6 are explanatory diagrams relating to the operation of the arrangment of FIGS. 2 and 3.
Figure 4B:
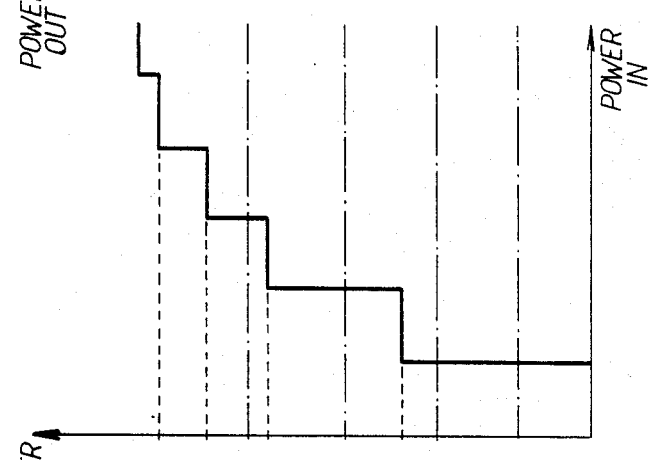
Figure 4A:
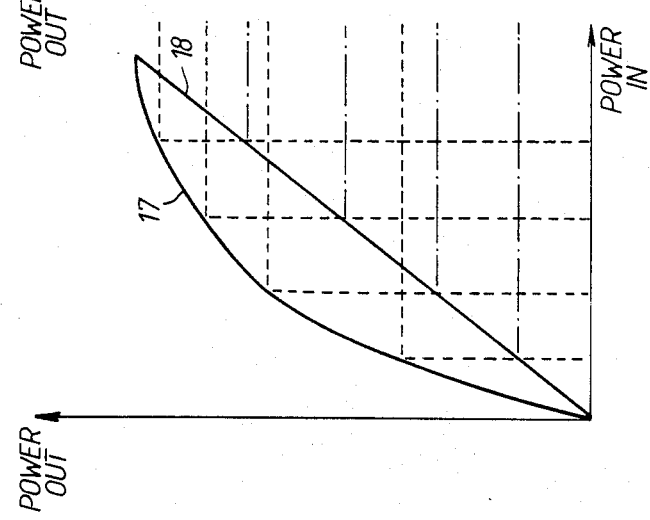
Figure 5:
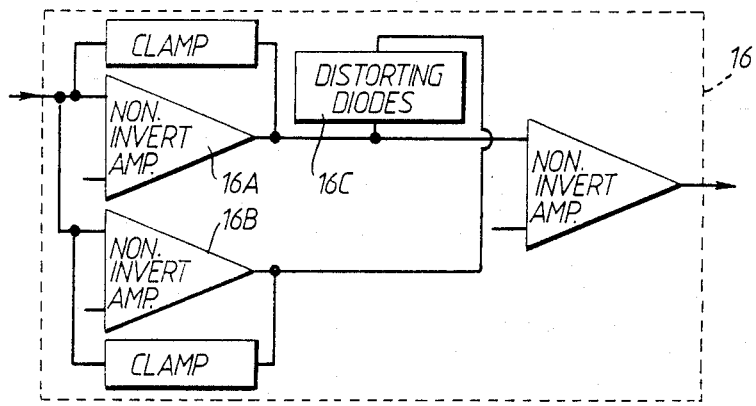
FIGS. 5 and 7 illustrate part of the arrangement of FIG. 2 in greater detail.

The wideband video linearity corrector 16 imposes a modification on the video signal which compensates for the non-linear power transfer characteristic of the klystron. An increase in the power of the input radio frequency signal results in a corresponding increase in the amplitude of the output radio frequency signal coupled from the final cavity. However, without correction, the relationship is not linear, as illustrated in FIG. 4a, by the curve denoted 17. A linear relationship is illustrated by line 18. The relationship between uncorrected input and output power is further illustrated in FIG. 4b, where, as the input power is increased in equal steps, it can be seen that the corresponding rise in output power is less at each increase. If a linear relationship existed, then increasing the input power in equal steps would result in increases in the output power which would also be in equal steps, as illustrated in FIG. 4c. The wideband video linearity corrector 16 modifies the signal it receives so as to compensate for the non-linear power transfer characteristic of the klystron at all frequencies within the desired passband of the klystron. The corrector 16 is illustrated in greater detail in FIG. 5 and comprises a combination of clamped operational amplifiers 16A and 16B, the outputs of which are applied to voltage controlled diodes 16C. This changes the gain of part of the amplitude transfer characteristic at adjustable levels within the voltage excursion of the video signal. The clamping arrangement ensures that the linearity correction remains consistent with changing average levels of the video signal. The diodes 16C are adjusted by observing the output of the klystron, such that when the modulating signal is a low frequency linearity signal, a linear output from the klystron is obtained.

Figure 6:
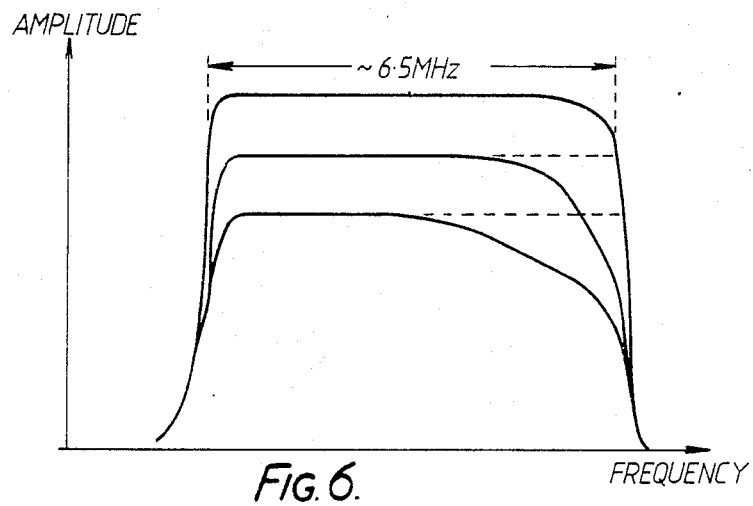
Figure 7:
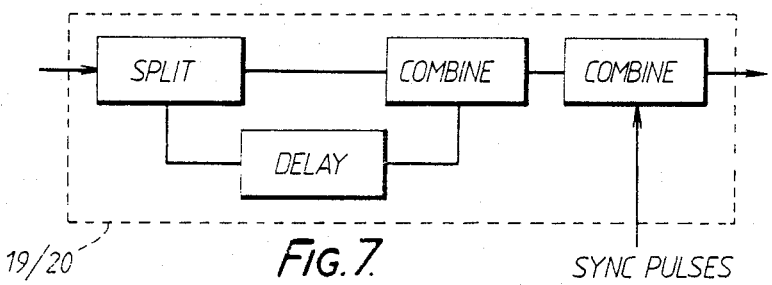

The output signal of the corrector 16 is then applied to a spectral corrector 19. This further modifies the wideband video signal to compensate for gain variations across the frequency passband. These variations exist because of the influence of the wideband video signal applied to the grid 2 on the klystron electron beam. This is illustrated in FIG. 6 where each curve corresponds to a particular input radio frequency signal power and beam current. At lower input radio frequency signal amplitudes, the amplitude of the radio frequency signal extracted from the final cavity of the klystron reduces with increasing frequency. The spectral corrector 19 is shown in greater detail in FIG. 7. The klystron characteristics are essentially modified to give substantially ideal characteristics, as represented by the broken lines of FIG. 6.

The output of the spectral corrector 19 is applied to a group delay and adder unit 20 which corrects for frequency dispersion and is a convenient point at which to impose synchronising pulses on the signal. The synchronising pulses may be added at any point along the path from the output line 10 to 11 followed by the signal which is to be applied to the grid 2. The wideband video signal at the output of the group delay and adder unit 20 is then amplified by a wideband linear amplifier 21, and applied to 11 and hence to the grid 2. Thus the klystron power transfer characteristic is modified so that it is substantially linear between input and output cavities in a full time modulation mode.

Alternatively of course the diodes may be adjusted to achieve a maximum operating efficiency rather than linearisation of the power transfer characteristic.

Although the arrangement of FIGS. 2 and 3 is described in relation to vision broadcasting only, sound radio frequency signals may also be added, i.e, the arrangement may be operated in a multiplex mode. Linearisation of the klystron characteristics to the modulated envelope of the vision signal results in a reduction of the absolute levels of generated intermodulation products when in a multiplex mode. This enables the transmitter arrangement to be operated in the multiplex mode at higher levels than hitherto whilst keeping the generated intermodulation products at levels which are similar to those obtained at lower operating power levels of a conventional arrangement in a multiplex mode.

We claim:

1. An amplifying arrangement including
   a klystron having an interaction cavity and a power transfer characteristic, an interaction cavity and a beam controlling electrode, said beam controlling electrode having a potential applied thereto;
   means for applying a high frequency carrier modulated with a modulating signal to said interaction cavity; and
   means for controlling the potential of said beam controlling electrode in dependence on the modulating signal, whereby the klystron power transfer characteristic is made substantially the same at substantially all frequencies over a desired passband of the klystron.

2. An arrangement as claimed in claim 1 and wherein said means for controlling the potential of the beam controlling electrode includes means for determining the frequency of the modulating signal and means for changing the amplitude of a signal applied to the electrode by an amount depending on the determined frequency.

3. An arrangement as claimed in claim 1 and including means for controlling the potential of the beam controlling electrode whereby the klystron power transfer characteristic is made substantially linear.

4. An arrangement as claimed in claim 1 and including means for controlling the potential of the beam controlling electrode whereby the operating efficiency of the klystron is substantially at a maximum.

5. An arrangement as claimed in claim 3 and including means for determining the amplitude of the modulating signal and means for controlling the potential of the beam controlling electrode according to the amplitude determined.

6. An arrangement as claimed in claim 4 and including means for determining the amplitude of the modulating signal and means for controlling the potential of the beam controlling electrode according to the amplitude determined.

7. An arrangement as claimed in claim 1 wherein an electron beam current flows within said klystron, and wherein the beam controlling electrode is a grid for controlling the magnitude of said electron beam current.

8. A transmitter arrangement for transmitting an output signal including
   a klystron having a power transfer characteristic, an interaction cavity and a beam controlling electrode, said beam controlling electrode having a potential applied thereto;
   means for applying a high frequency carrier modulated with a modulating signal to said interaction cavity; and
   means for controlling the potential of said beam controlling electrode in dependence on the modulating signal, whereby the klystron power transfer characteristic is made substantially the same at substantially all frequencies over a desired passband of the klystron.

9. A transmitter arrangement as claimed in claim 8 and wherein said modulating signal includes simultaneous video and sound signals, said transmitter arrangement being operated in a multiplexed mode.

10. A transmitter arrangement as claimed in claim 8 and wherein said output signal is a television signal.

* * * * *